(12) United States Patent
Ramanujan (10) Patent No.: US 9,129,674 B2
(45) Date of Patent: Sep. 8, 2015

(54) HYBRID MEMORY DEVICE

(71) Applicant: Intel Corporation, Santa Clara, CA (US)

(72) Inventor: Raj K. Ramanujan, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 13/928,694

(22) Filed: Jun. 27, 2013

(65) Prior Publication Data

US 2015/0003175 A1    Jan. 1, 2015

(51) Int. Cl.
*G11C 14/00* (2006.01)
*G06F 12/00* (2006.01)

(52) U.S. Cl.
CPC .......... *G11C 14/0009* (2013.01); *G06F 12/00* (2013.01)

(58) Field of Classification Search
CPC ................. H01L 27/2481; H01L 21/8221
USPC .......................................... 365/189.17, 189.2
See application file for complete search history.

(56) References Cited

U.S. PATENT DOCUMENTS

| 7,716,411 | B2 * | 5/2010 | Panabaker et al. ............ 711/101 |
| 2006/0294295 | A1 * | 12/2006 | Fukuzo ........................ 711/105 |
| 2007/0168793 | A1 | 7/2007 | Seo | |
| 2008/0046643 | A1 | 2/2008 | Kozakai et al. | |
| 2009/0193193 | A1 * | 7/2009 | Kern ............................ 711/128 |
| 2010/0217924 | A1 | 8/2010 | Panabaker et al. | |
| 2012/0063235 | A1 * | 3/2012 | Yoon et al. ............... 365/185.23 |
| 2012/0239863 | A1 | 9/2012 | Rao | |
| 2012/0297129 | A1 | 11/2012 | Klein | |

FOREIGN PATENT DOCUMENTS

WO    2014/209891 A1    12/2014

OTHER PUBLICATIONS

Singh, "Non-volatile SRAMs(nvSRAMs) in Gaming Applications," Cypress Semiconductor, Apr. 2012.*
International Search Report received for PCT Application No. PCT/US2014/043678, mailed on Oct. 15, 2014, 4 pages.

* cited by examiner

*Primary Examiner* — Alexander Sofocleous
*Assistant Examiner* — Muhammad Islam
(74) *Attorney, Agent, or Firm* — Alpine Technology Law Group LLC (57) ABSTRACT

Memory devices, controllers, and electronic devices comprising memory devices are described. In one embodiment, a memory device comprises a volatile memory, a nonvolatile memory, and a controller comprising a memory buffer, and logic to transfer data between the nonvolatile memory and the volatile memory via the memory buffer in response to requests from an application, wherein data in the memory buffer is accessible to the application. Other embodiments are also disclosed and claimed.

17 Claims, 10 Drawing Sheets

HYBRID MEMORY DEVICE

FIELD

The present disclosure generally relates to the field of electronics. More particularly, some embodiments of the invention generally relate to hybrid memory devices.

BACKGROUND

Continuing advances in system architecture, e.g., multi-core processing, and advances in application require corresponding advances in memory systems. High capacity memory is becoming increasingly important with increases in the number of cores in a processor system the number of applications, e.g., in-memory databases and virtualized servers, that require significantly higher memory capacity. The ability to scale existing memory systems (e.g., double data rate direct in-line memory modules (DDR DIMMs)) is limited due to several factors including cost, power consumption, density, and performance. A typical large memory platform may contain as many as 16 DIMMs or greater. This creates challenges in component placement, cooling, as well as routing of signals, all of which adds to the cost of these systems.

In addition to capacity, persistent memory is increasingly useful in certain applications. A typical example is an in-memory database where the time to build the memory image can be considerably large as the size of the database grows. The ability to maintain the memory contents across power cycling may reduce start-up time and remove the requirement for redundant active or stand-by servers.

Accordingly, hybrid memory devices may find utility.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Some memory systems may be implemented using local, fast-access memory which is frequently embodied as a volatile memory and which may function as a cache memory and one or more remote memory devices which may comprise nonvolatile memory, e.g., magnetic or optical memory. By way of example, remote memory devices may comprise one or more direct in-line memory modules (DIMMs), each of which may comprise one or more memory ranks which in turn may comprise one or more Dynamic Random Access Memory (DRAM) chips or may include nonvolatile memory, e.g., 3-dimensional cross-point memory, flash memory, ferroelectric memory, silicon-oxide-nitride-oxide-silicon (SONOS) memory, polymer memory, memory, nanowire, ferroelectric transistor random access memory (FeTRAM or FeRAM), nanowire or electrically erasable programmable read-only memory (EEPROM). Some electronic devices (e.g., smart phones, tablet computers, and the like) may comprise simpler remote memory systems comprised of one or more DRAMs.

Described herein are hybrid memory devices which comprise a volatile memory (e.g., DRAM) and a nonvolatile memory. The devices further comprise a controller comprising a memory buffer and logic to transfer data between the nonvolatile memory and the volatile memory via the memory buffer in response to requests from an application, wherein data in the memory buffer is accessible to the application. An electronic device which incorporates the memory device may comprise a processor to execute an operating system and one or more applications and an operating system device driver to manage memory access operations between the at least one application and the memory device.

The techniques discussed herein may be provided in various computing systems (e.g., including servers, desktops, notebooks, smart phones, tablets, portable game consoles, etc.) which may include a memory system comprising multiple DRAM chips commonly assembled into a dual in-line memory module (DIMM) and nonvolatile memory. In such embodiments, one or more DIMMs may comprise separate control logic.

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Figure 1:
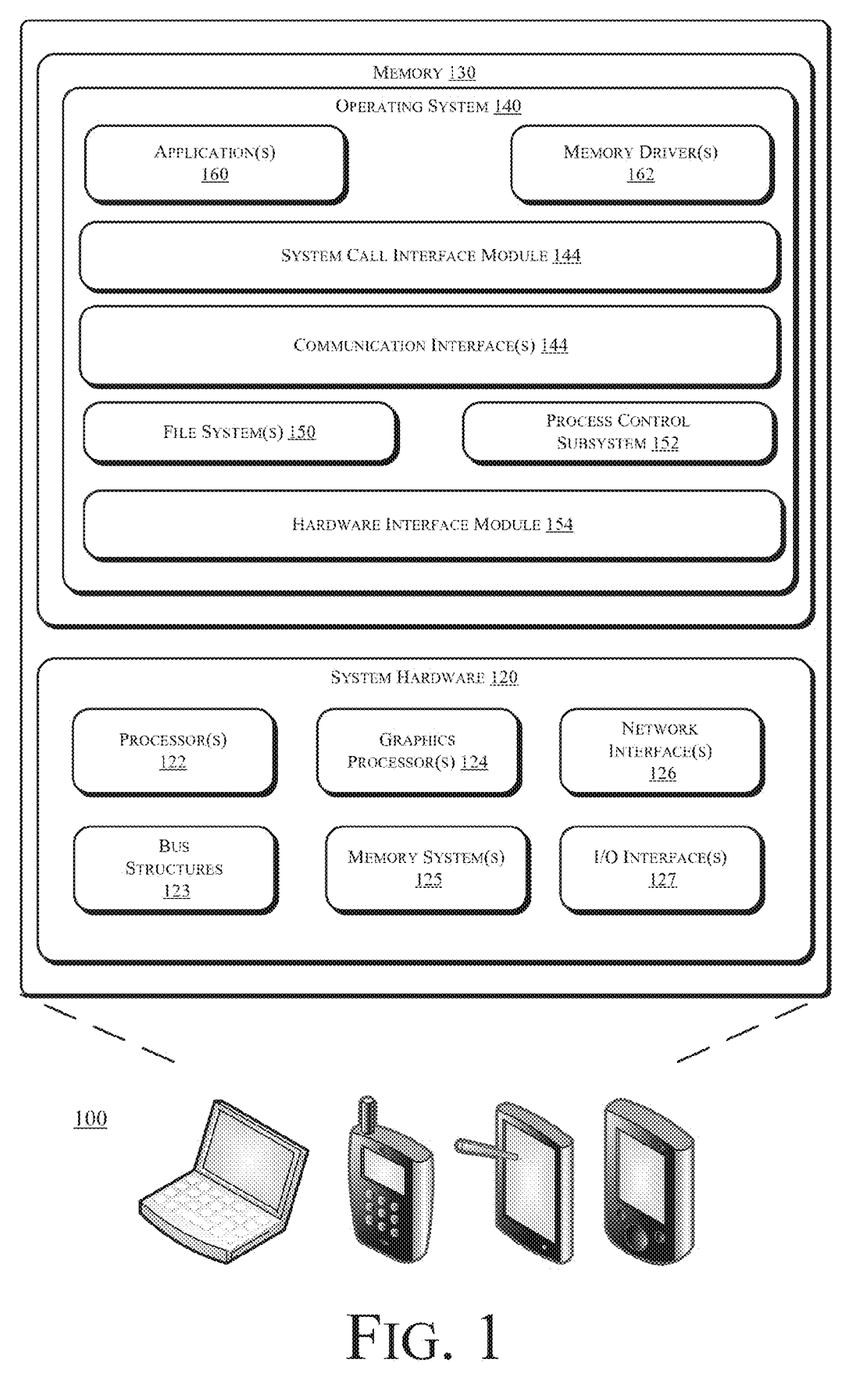
FIG. 1 is a schematic, block diagram illustration of components of apparatus to implement a hybrid memory device in accordance with various embodiments discussed herein.

FIG. 1 is a schematic illustration of an exemplary electronic device 100 which may be adapted incorporate a hybrid memory device as described herein, in accordance with some embodiments. In various embodiments, the electronic device 100 may be embodied as a personal computer, a laptop computer, a personal digital assistant, a mobile telephone, an entertainment device, a tablet computer, an electronic reader, or another computing device.

The electronic device 100 includes system hardware 120 and memory 130, which may be implemented as random access memory and/or read-only memory. A power source such as a battery 180 may be coupled to the electronic device 100.

System hardware 120 may include one or more processors 122, bus structures 123, one or more graphics processors 124, memory systems 125, network interfaces 126, and input/output interfaces 127. In one embodiment, processor 122 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Bus structures 123 connect various components of system hardware 120. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Graphics processor(s) 124 may function as adjunct processor that manages graphics and/or video operations. Graphics processor(s) 124 may be integrated onto the motherboard of electronic device 100 or may be coupled via an expansion slot on the motherboard.

Memory systems 125 may comprise local memory, e.g., cache memory, one or more forms of volatile memory and nonvolatile memory, as described above.

In one embodiment, network interface(s) 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

I/O interface(s) 127 may be implemented on one or more I/O devices, e.g., a display, a touch screen, one or more speakers, a keyboard, a mouse, a touchpad, or the like.

Memory 130 may store an operating system 140 for managing operations of electronic device 100. In one embodiment, operating system 140 includes a hardware interface module 154, e.g., a one or more operating system device drivers, that provides an interface to system hardware 120. In addition, operating system 140 may include a file system 150 that manages files used in the operation of electronic device 100 and a process control subsystem 152 that manages processes executing on electronic device 100.

Operating system 140 may include (or manage) one or more communication interfaces that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

In some embodiments memory 130 may store one or more applications 160 which may execute on the one or more processors 122 under the supervision of operating system 140 and one or more memory drivers 162. The applications 160 and driver 162 may be embodied as logic instructions stored in a tangible, non-transitory computer readable medium (i.e., software or firmware) which may be executable on one or more of the processors 122. Alternatively, these applications may be embodied as logic on a programmable device such as a field programmable gate array (FPGA) or the like. Alternatively, these applications may be reduced to logic that may be hardwired into an integrated circuit.

Figure 2A:
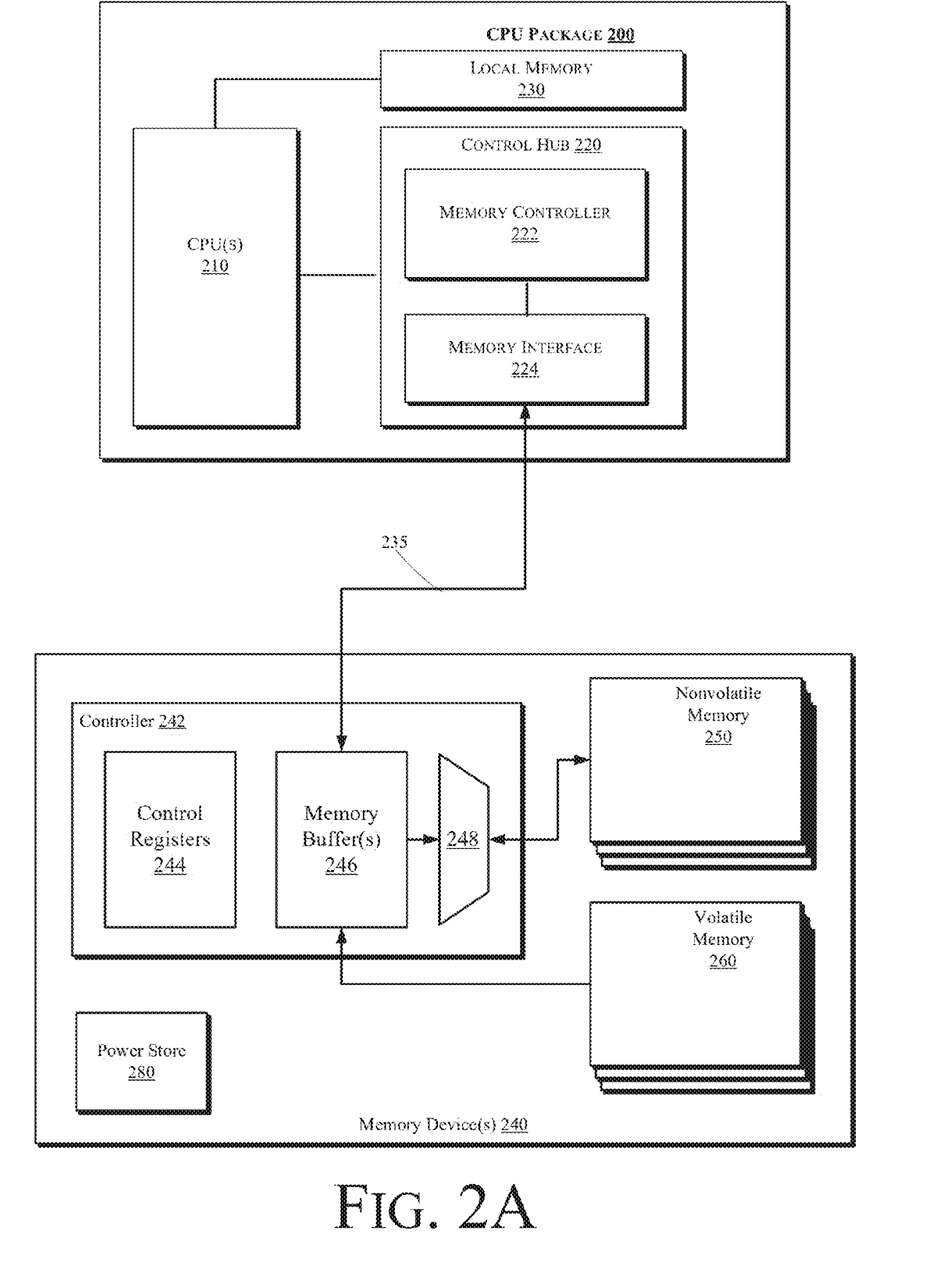
FIG. 2A is a schematic, block diagram of an exemplary architecture in which a hybrid memory device may be implemented in accordance with various embodiments discussed herein.

FIG. 2A is a schematic, block diagram of an exemplary architecture in which a hybrid memory device may be implemented in accordance with various embodiments discussed herein. Referring to FIG. 2A, in some embodiments a central processing unit (CPU) package 200 which may comprise one or more CPUs 210 coupled to a control hub 220 and a local memory 230. Control hub 220 comprises a memory controller 222 and a memory interface 224.

Memory interface 224 is coupled to one or more remote memory devices 240 by a communication bus 235. In one example, communication bus 235 may be a double data rate memory bus.

Memory device 240 may comprise a controller 242 and a nonvolatile memory 250, a volatile memory 260, and a power store 280. Controller 242 comprises one or more control registers 244 and memory buffers 246 and an input/output interface such as a multiplexer 248.

In various embodiments, nonvolatile memory 250 may be implemented using, e.g., phase change memory, NAND (flash) memory, ferroelectric random-access memory (FeTRAM), nanowire-based non-volatile memory, memory that incorporates memristor technology, a static random access memory (SRAM), three dimensional (3D) cross point memory such as three dimensional (3D) cross point memory such as phase change memory (PCM), spin-transfer torque memory (STT-RAM) or NAND memory.

Figure 2B:
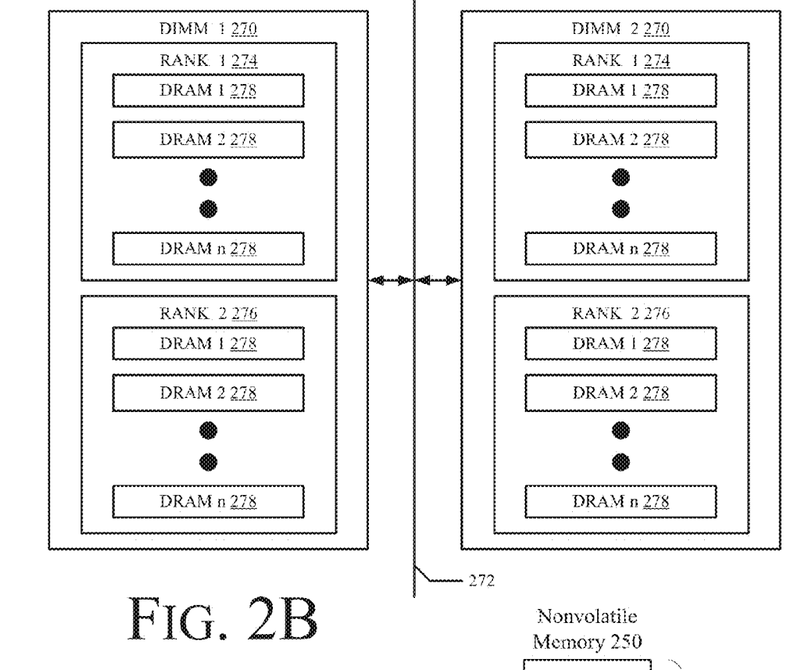
FIG. 2B is a schematic illustration of a volatile memory in accordance with various embodiments discussed herein.

In various embodiments, volatile memory 260 may be implemented using one or more DRAM memory modules. By way of example, referring to FIG. 2B, in some embodiments the volatile memory 260 may comprise one or more direct in-line memory modules (DIMMs) 270 coupled to a memory channel 272 which provides a communication link to memory controller 122. In the embodiment depicted in FIG. 2B each DIMM 270 comprises a first rank 274 and a second rank 276, each of which includes a plurality of DRAM modules 278. One skilled in the art will recognize that volatile memory 260 may comprise more or fewer DIMMs 270, and more or fewer ranks per DIMM. Further, some electronic devices (e.g., smart phones, tablet computers, and the like) may comprise simpler memory systems comprised of one or more DRAMs.

Figure 3:
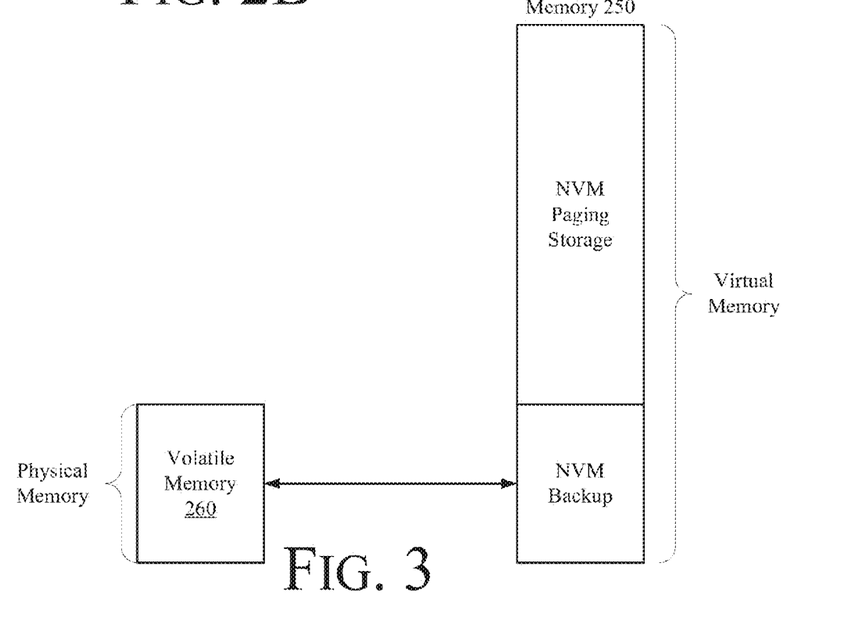
FIG. 3 is a schematic illustration of a memory mapping in accordance with various embodiments discussed herein.

Referring to FIG. 3, in some embodiments the nonvolatile memory 250 is larger than the volatile memory 260. This allows for an addressing scheme in which the system physical memory exposed to the operating system 140 is limited by the size of the volatile memory 260. The nonvolatile memory 250 includes a backup region which provides a nonvolatile memory backup of the volatile memory 260. The rest of the nonvolatile memory address space is available as paging space to be managed by the driver 162. Thus, the overall virtual address space available to the application(s) 160 can be the total nonvolatile physical memory address space.

Normally, an operating system limits paging from nonvolatile storage device, for example, hard disk drive or solid state drive, to virtual memory by ensuring the allocated virtual memory has adequate system physical memory backing it. Paging is usually limited to resuming a process after a period of inactivity. In the memory device 240, copying from nonvolatile memory 250 to volatile memory takes place on the same memory device, for example, DIMM, and can take place very rapidly. Additionally, an application 160 may be allowed access to data while the copying from non volatile memory to volatile memory is ongoing. This allows the application 160 and the driver 162 to handle page-faults in a synchronous manner.

Furthermore, since all the data movement between the nonvolatile memory 250 and volatile memory 260 is kept on the memory device 240 the communication channel 235 is only utilized for actual data access by the processor. This limited data movement profile can significantly reduce the power required to implement virtual memory paging.

These factors allow for more dynamic paging between nonvolatile memory 250 and volatile memory 260 thus providing a much larger virtual address space for an application 160 to use. Memory accesses by the applications are directed to volatile memory and hence get high memory performance.

Figure 4:
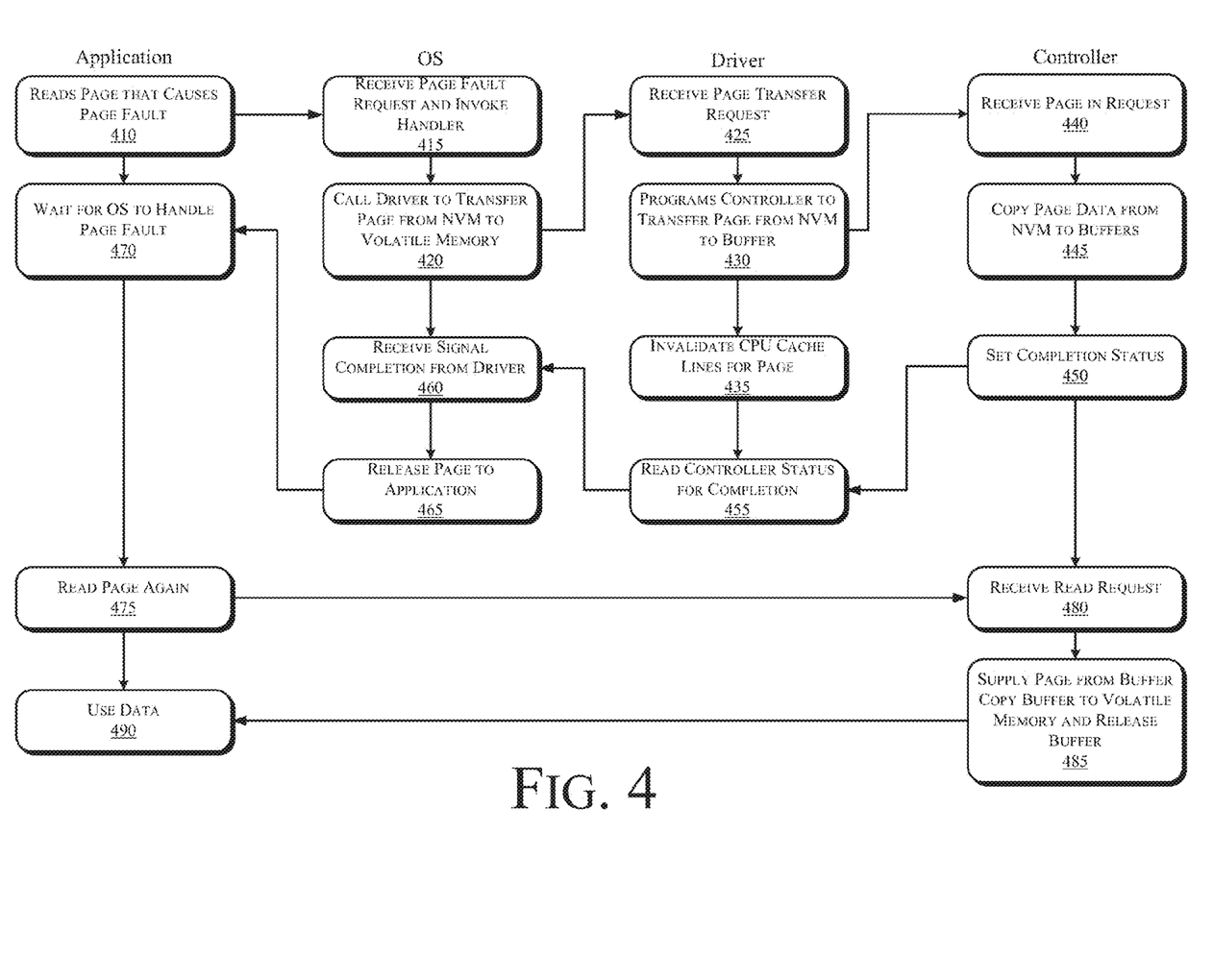
FIGS. 4-5 are flowcharts illustrating operations in a method to implement a hybrid memory device in accordance with various embodiments discussed herein.
Figure 5:
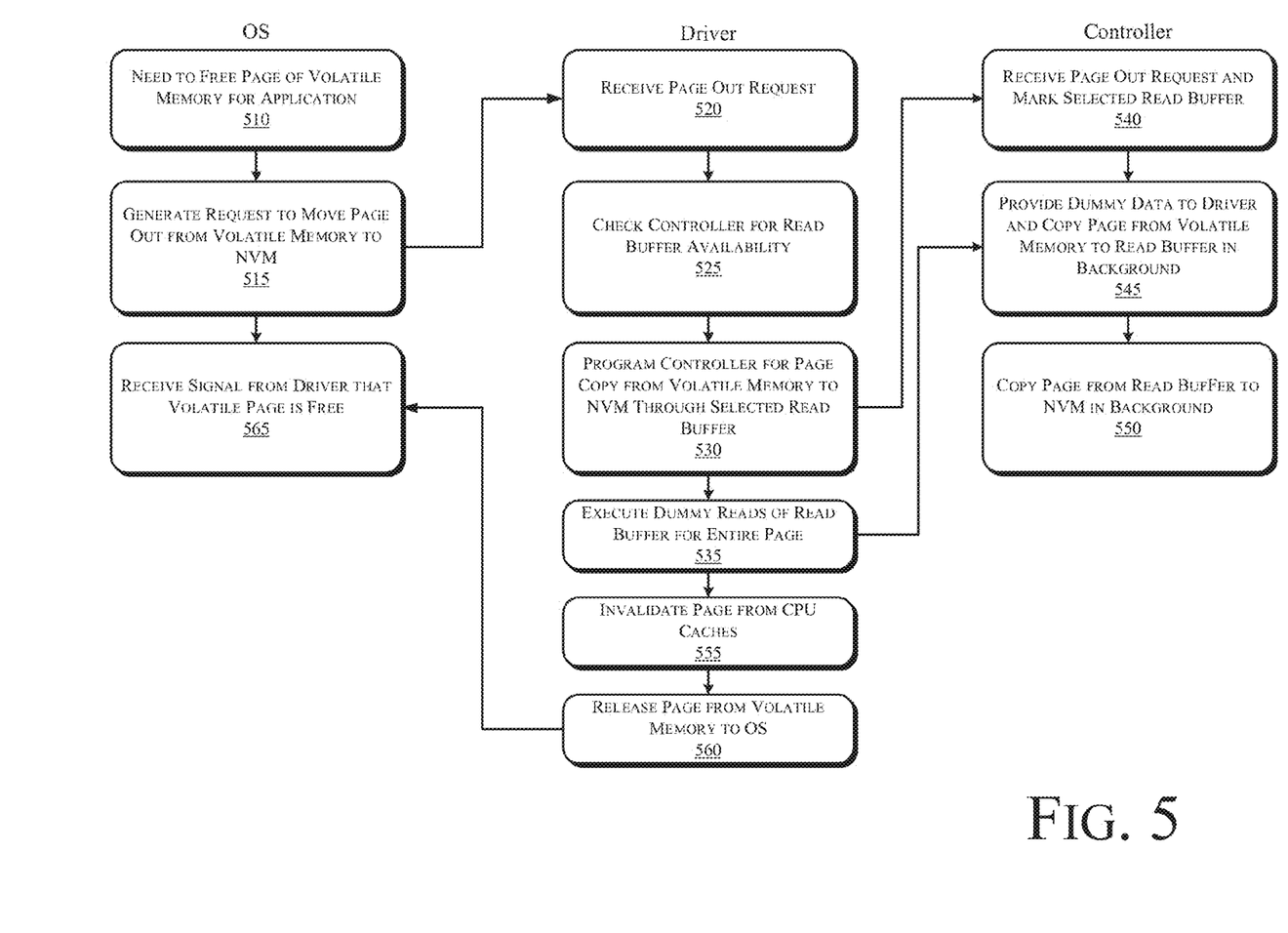

As described above, in some embodiments the controller 242 in the memory device(s) 240 cooperates with a driver 162 in the electronic device 100 to manage memory operations in the memory device 240. Operations implemented by controller 242 and/or driver 162 will be described with reference to FIGS. 4-5. FIG. 4 illustrates operations implemented to manage copying one or more pages from nonvolatile memory 250 to volatile memory 260 (i.e., a page-in operation), while FIG. 5 illustrates operations implemented to manage copying one or more pages from volatile memory to nonvolatile memory (i.e., a page-out operation).

Referring first to FIG. 4, at operation 410 an application 160 reads a page that causes a page fault which results in a page fault being sent to the operating system 140. At operation 415 the operating system 140 receives a page fault request from the application 160 and, in response to the page fault request, calls (operation 420) the driver 162 to transfer a page of data requested by the application 160 from nonvolatile memory 250 to volatile memory 260 (i.e., a page-in request). At operation 425 the driver receives the page transfer request, and at operation 430 the driver 162 programs the controller 242 to transfer a page from nonvolatile memory 250 to the buffer 246. The data request is forwarded to the controller 242 in the memory device(s) 240 via the bus 235. At operation 435 the driver 162 invalidates cache lines for the page in the CPUs 210.

At operation 440 the controller 242 receives the page-in request, and at operation 445 the controller 242 copies the requested page of data from nonvolatile memory 250 to the memory buffers 246 in the controller 242. At operation 450 the controller 242 sets a completion status signal, which is returned to the driver 162. At operation 455 the driver 162 reads the status signal, which is passed to the operating system 140.

At operation 460 the operating system 140 receives the signal completion from the driver 162, and at operation 465 the operating system 140 releases the page to the application 160d. At operation 470 the application waits for the operating system 140 to handle the page fault. When the page is released to the application control passes to operation 470 and the application 160 reads the page of data from the memory buffers 240 (operation 475). At operation 480 the controller 242 receives the read request, and in response to the read request at operation 485 the controller 242 supplies the page from the buffers 246 to the nonvolatile memory 250 and releases the buffer. As the application reads the data, the controller 242 writes (operation 455) the page data to the volatile memory 260 and invalidates the buffer on a cache line-by-cache line basis. Thus, the page-in operation ensures there is no address conflict for the nonvolatile memory 260. In subsequent page fault operations, if the driver 162 finds no free memory in buffer 246 then the driver 162 can flush the buffers to the volatile memory 260, e.g., by performing dummy writes over the bus 260 to a single memory line. This ensures there is no conflict in nonvolatile memory access between the CPU 210 and the buffer transfer. At operation 490 the application 160 uses the new data.

Referring to FIG. 5, in a page-out operation an application or the operating system 140 needs (operation 510) to free a page of volatile memory 150 for use by an application 160. At operation 515 the operating system 140 requests the driver 162 to move a page of data from the volatile memory 260 to the nonvolatile memory 250. At operation 520 the driver 162 receives the request and checks (operation 525) to ensure that the memory buffer 246 is available for a read operation. At operation 530 the driver 162 programs the controller 242 for a page copy from the volatile memory 260 to nonvolatile memory 250 through the buffers 246.

At operation 535 the driver 162 executes a series of read operations to a "dummy" location in the memory buffer 246 of the controller 242. By way of example, the driver may execute 64 cache line read operations for a 4 KB page. The "dummy" read operations keep the CPU 210 busy reading the dummy locations while the controller copies the page from volatile memory 260 to nonvolatile memory 250. This avoids a potential conflict between reading the page from volatile memory 260 into the buffer 246 and the CPU 210 trying to read the volatile memory 260 for another application.

At operation 540 the controller 242 receives the page out request. At operation 545 the controller 242 provides dummy data to the driver 162 and at operation 550 the controller 242 copies page data from the volatile memory 260 to the buffer 246 as a background operation. The dummy read operation keep the buffers 246 busy until the page data is copied. In some embodiments the controller 242 implements a read operation from volatile memory 260 for every dummy read operation performed in operation 530, which avoids conflicts in access to the volatile memory 260.

At operation 555 the driver 162 invalidates the page from cache memory in the CPU(s) 210, and at operation 560 the driver 162 releases the page from volatile memory 260 to the operating system. At operation 565 the operating system 140 receives the signal from the driver 162 that the page of data is freed from the volatile memory.

Figure 6:
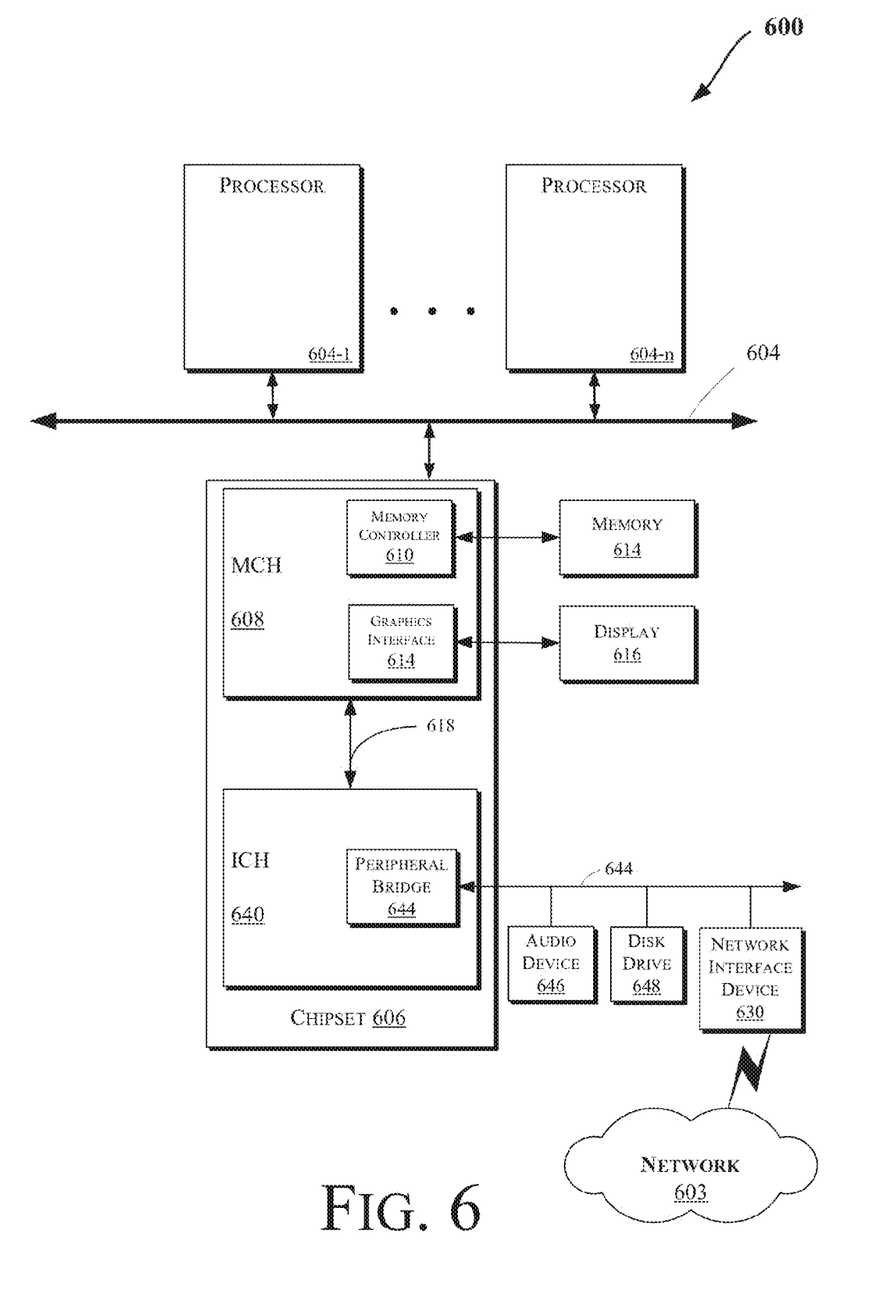
FIGS. 6-10 are schematic, block diagram illustrations of electronic devices which may be adapted to implement a hybrid memory device in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3.

Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
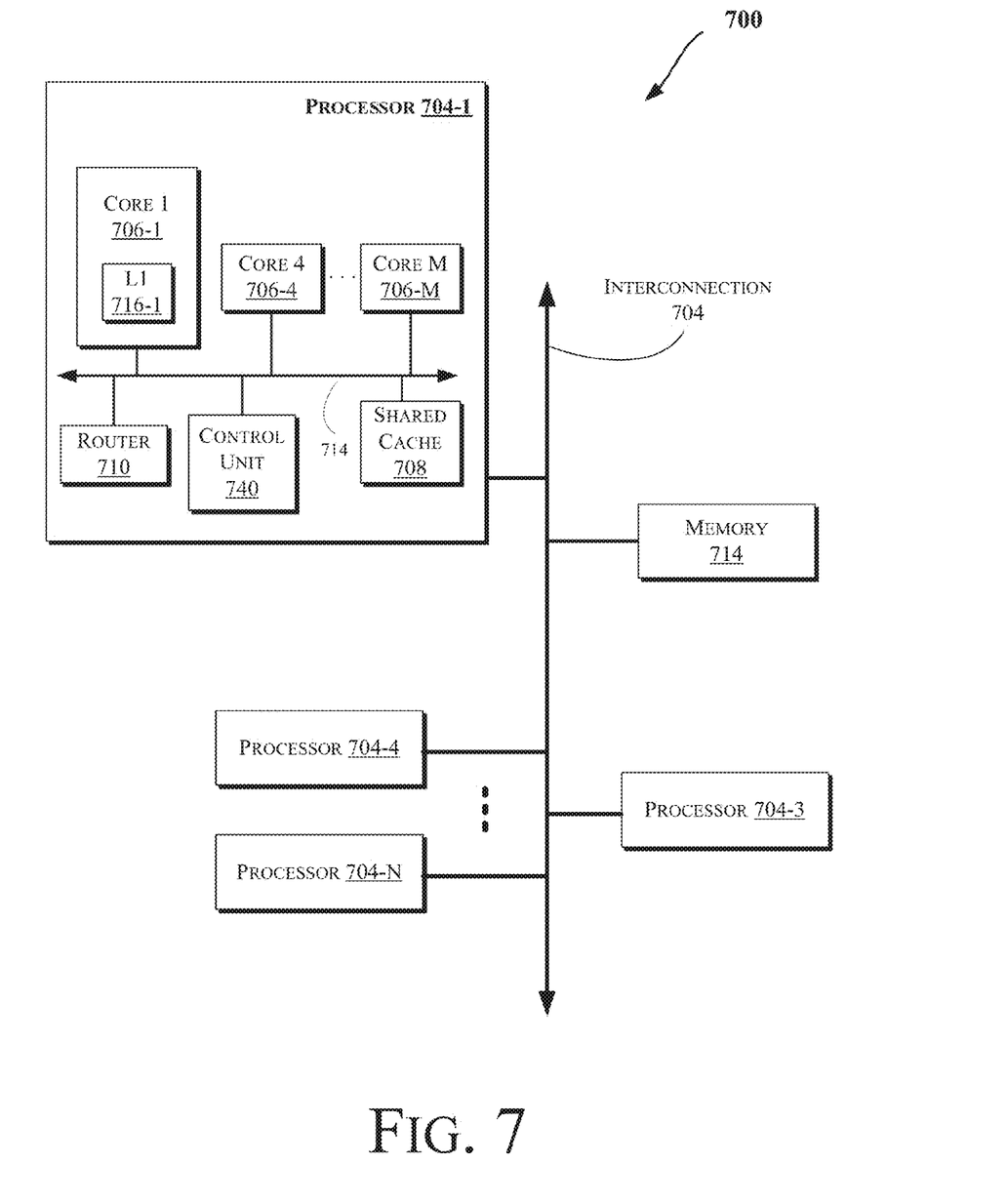

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
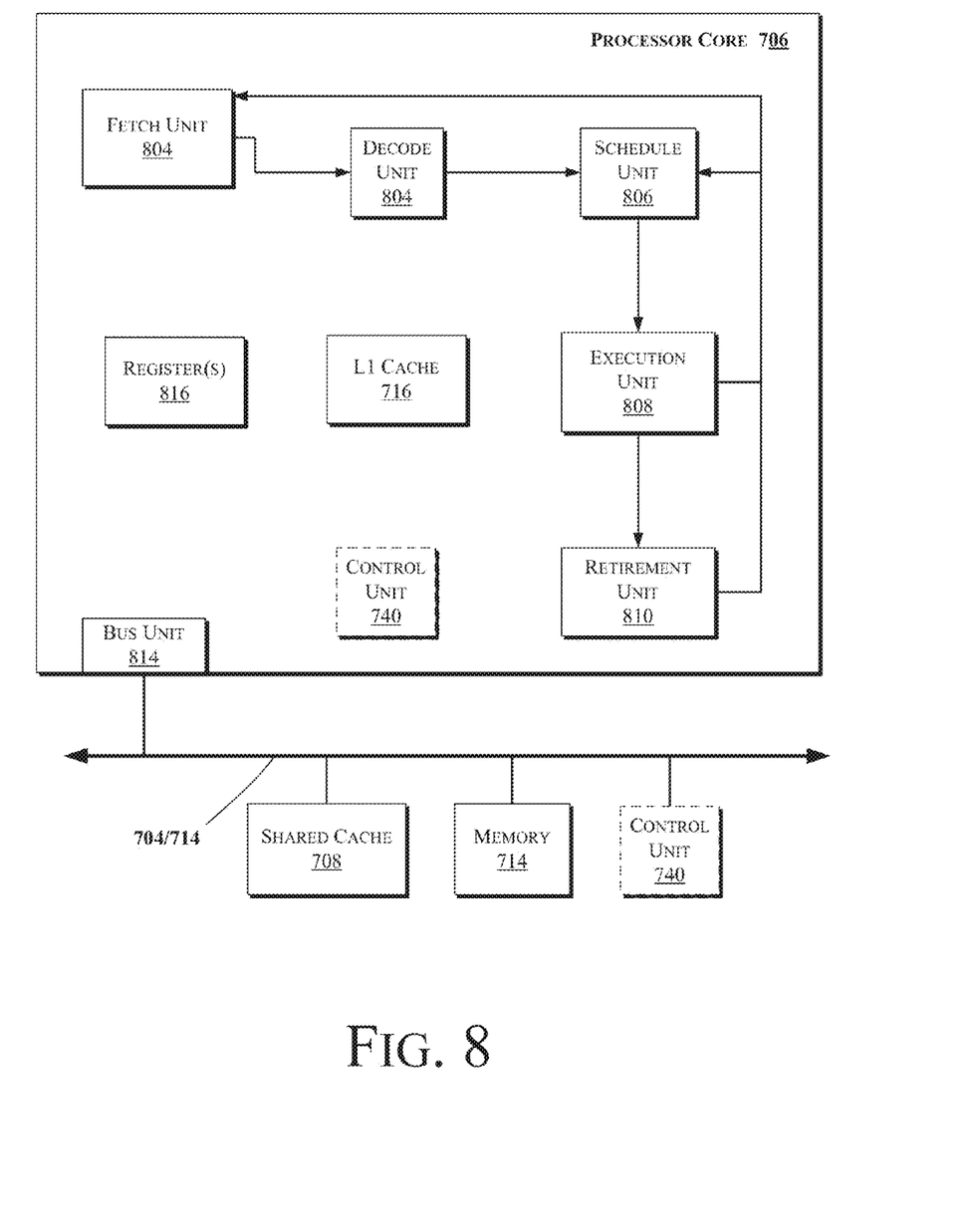

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
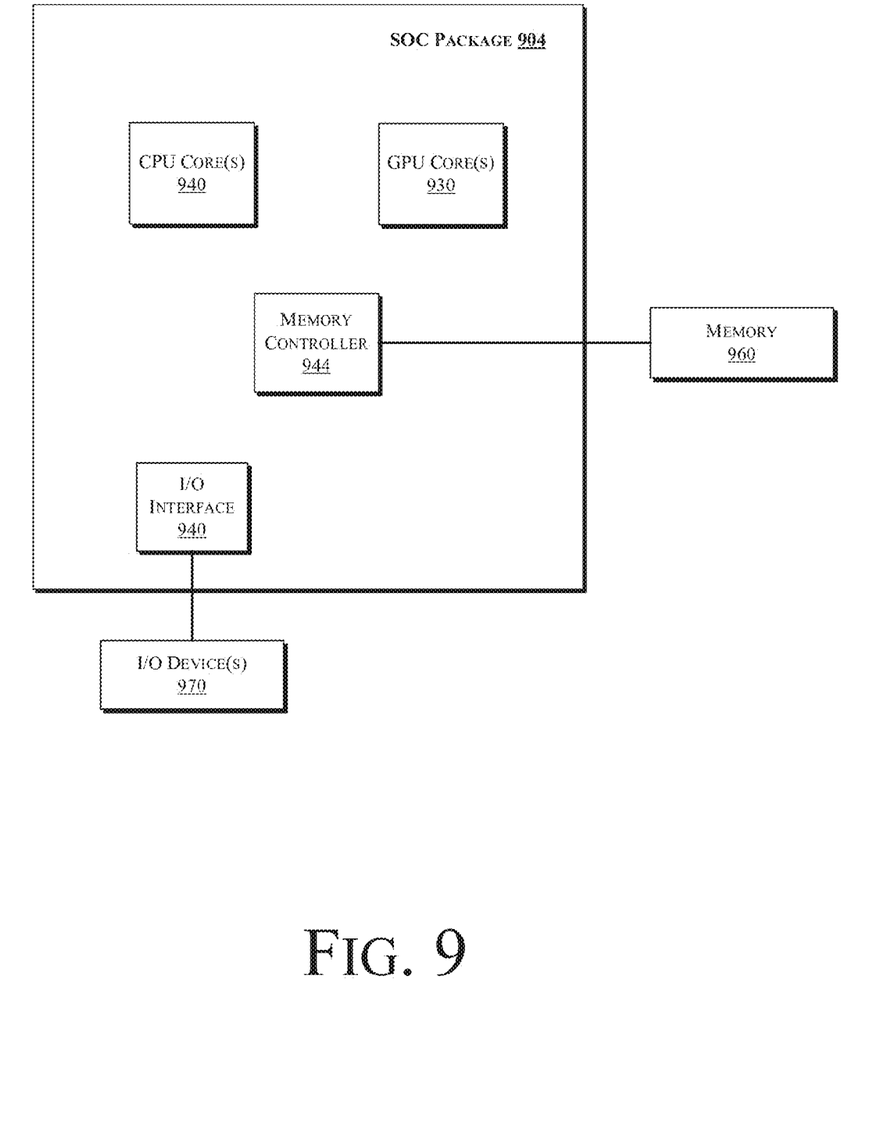

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
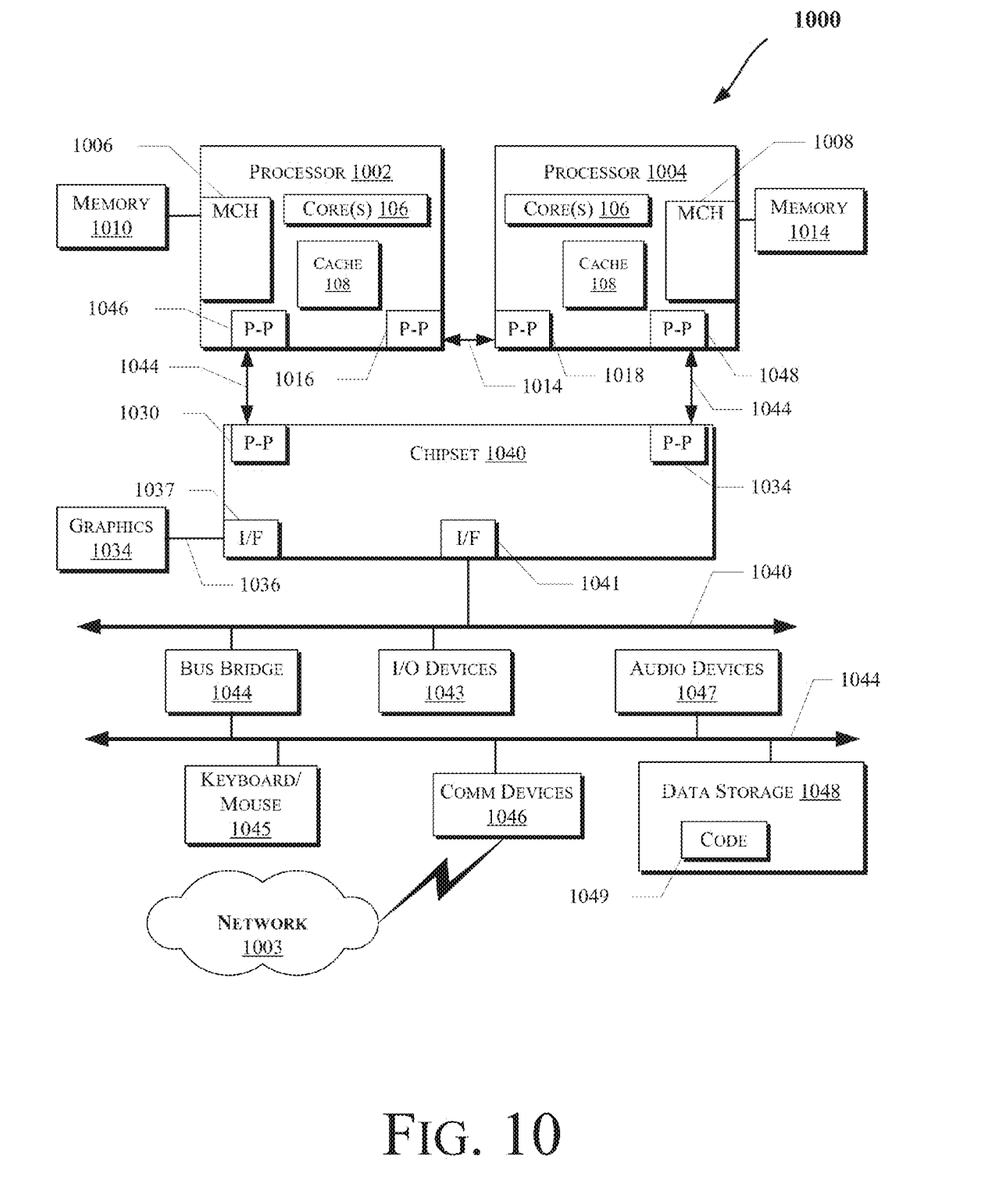

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1004. Other embodiments of the invention, however, may exist in other circuits, logic units, or devices within the system 1000 of FIG. 10. Furthermore, other embodiments of the invention may be distributed throughout several circuits, logic units, or devices illustrated in FIG. 10.

The chipset 1020 may communicate with a bus 1040 using a PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 1003), audio I/O device, and/or a data storage device 1048. The data storage device 1048 (which may be a hard disk drive or a NAND flash based solid state drive) may store code 1049 that may be executed by the processors 1004.

The following examples pertain to further embodiments.

Example 1 is a memory device comprising a volatile memory, a nonvolatile memory, and a controller comprising a memory buffer, and logic to transfer data between the nonvolatile memory and the volatile memory via the memory buffer in response to requests from an application, wherein data in the memory buffer is accessible to the application.

In Example 2, the volatile memory of Example 1 can optionally include dynamic random access memory (DRAM) and the nonvolatile memory comprises a 3 dimensional cross-point memory.

In Example 3, the subject matter of any one of Examples 1-2 can optionally include a nonvolatile memory which provides a backup for the volatile memory.

In Example 4, the subject matter of any one of Examples 1-3 can optionally include logic to receive a page-in request, and in response to the page-in request, to move a page of data from the nonvolatile memory to the memory buffer, provide a signal to the application that the page of data is available, and in response to a read operation from the application, write a page of data from the memory buffer to the volatile memory.

In Example 5, the subject matter of any one of Examples 1-4 can optionally include a memory buffer which comprises a plurality of cache lines, and the controller further comprises logic to invalidate the cache lines in the memory buffer when the cache line is written to the volatile memory.

In Example 6, the subject matter of any one of Examples 1-5 can optionally include logic to receive a page-out request, and in response to the page-out request to receive a read operation to a predetermined address, in response to the read operation, reading a page of data from the nonvolatile memory to the memory buffer, and writing the page of data to the nonvolatile memory.

In Example 7, the subject matter of any one of Examples 1-6 can optionally include a power store.

Example 8 is an electronic device comprising a processor to execute an operating system and at least one application, and a memory device comprising a volatile memory, a nonvolatile memory, and a controller comprising, a memory buffer, and logic to transfer data between the nonvolatile memory and the volatile memory via the memory buffer in response to requests from the application, wherein data in the memory buffer is accessible to the application, and a driver to manage memory access operations between the at least one application and the memory device.

In Example 9, the volatile memory of Example 8 can optionally include volatile memory comprises dynamic random access memory (DRAM); and the nonvolatile memory comprises a 3 dimensional cross-point memory.

In Example 10, the subject matter of any one of Examples 8-9 can optionally include a nonvolatile memory which provides a backup for the volatile memory.

In Example 11, the subject matter of any one of Examples 8-10 can optionally include logic to generate a page-in request to move a page of data from non-volatile memory to volatile memory and invalidate one or more cache lines in the processor for the page.

In Example 12, the subject matter of any one of Examples 8-11 can optionally include logic to receive the page-in request, and in response to the page-in request, to move a page of data from the nonvolatile memory to the memory buffer, provide a signal to the application that the page of data is available, and in response to a read operation from the application, write a page of data from the memory buffer to the volatile memory.

In Example 13, the subject matter of any one of Examples 8-12 can optionally include a memory buffer which comprises a plurality of cache lines, and logic to invalidate the cache lines in the memory buffer when the cache line is written to the volatile memory.

In example 14, the subject matter of any one of Examples 8-13 can optionally include logic to generate a page-out request to move a page of data from non-volatile memory to volatile memory.

In Example 15, the subject matter of any one of Examples 8-14 can optionally include logic to receive the page-out request, and in response to the page-out request, to receive a read operation to a predetermined address, in response to the read operation, reading a page of data from the nonvolatile memory to the memory buffer, and write the page of data to the nonvolatile memory.

In Example 16, the subject matter of any one of Examples 8-15 can optionally include a power store.

Example 17 is a controller for a memory device comprising a volatile memory and a nonvolatile memory, the controller comprising a memory buffer and logic to transfer data between the nonvolatile memory and the volatile memory via the memory buffer in response to requests from an application, wherein data in the memory buffer is accessible to the application.

In Example 18, the volatile memory of Example 17 can optionally include volatile memory comprises dynamic random access memory (DRAM); and the nonvolatile memory comprises a 3 dimensional cross-point memory.

In Example 19, the subject matter of any one of Examples 17-18 can optionally include a nonvolatile memory which provides a backup for the volatile memory.

In Example 20, the subject matter of any one of Examples 17-19 can optionally include logic to receive the page-in request, and in response to the page-in request, to move a page of data from the nonvolatile memory to the memory buffer, provide a signal to the application that the page of data is available, and in response to a read operation from the application, write a page of data from the memory buffer to the volatile memory.

In Example 21, the subject matter of any one of Examples 17-20 can optionally include a memory buffer which comprises a plurality of cache lines, and logic to invalidate the cache lines in the memory buffer when the cache line is written to the volatile memory.

In Example 22, the subject matter of any one of Examples 17-21 can optionally include logic to receive the page-out request, and in response to the page-out request, to receive a read operation to a predetermined address, in response to the read operation, reading a page of data from the nonvolatile memory to the memory buffer, and write the page of data to the nonvolatile memory.

Example 23 is a computer program product comprising logic instructions stored on a non-transitory computer readable medium which, when executed by a controller for a memory device comprising a volatile memory and a nonvolatile memory, configure the controller to logic to transfer data between the nonvolatile memory and the volatile memory via a memory buffer in response to requests from an application, wherein data in the memory buffer is accessible to the application.

In Example 24, the subject matter of Example 23 can optionally include logic instructions stored on a non-transitory computer readable medium which, when executed by a controller for a memory device comprising a volatile memory and a nonvolatile memory, configure the controller to receive a page-in request, and in response to the page-in request, to move a page of data from the nonvolatile memory to the memory buffer, provide a signal to the application that the page of data is available, and in response to a read operation from the application, write a page of data from the memory buffer to the volatile memory.

In Example 25, the subject matter of any one of Examples 23-24 can optionally include a memory buffer which comprises a plurality of cache lines, and logic instructions stored on a non-transitory computer readable medium which, when executed by a controller for a memory device comprising a volatile memory and a nonvolatile memory, configure the controller to invalidate the cache lines in the memory buffer when the cache line is written to the volatile memory.

In Example 26, the subject matter of any one of Examples 23-25 can optionally include logic instructions stored on a non-transitory computer readable medium which, when executed by a controller for a memory device comprising a volatile memory and a nonvolatile memory, configure the controller to receive a page-out request, and in response to the page-out request, to receive a read operation to a predetermined address, in response to the read operation, read a page of data from the nonvolatile memory to the memory buffer, and write the page of data to the nonvolatile memory.

In various embodiments of the invention, the operations discussed herein may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A memory device comprising:
a volatile memory;
a nonvolatile memory; and
a controller comprising:
a memory buffer; and
logic to transfer data between the nonvolatile memory and the volatile memory via the memory buffer in response to requests from an application, wherein data in the memory buffer is accessible to the application;
logic to receive a page-in request, and in response to the page-in request, to:
move a page of data from the nonvolatile memory to the memory buffer;
provide a signal to the application that the page of data is available; and
in response to a read operation from the application, write a page of data from the memory buffer to the volatile memory.

2. The memory device of claim 1, wherein:
the volatile memory comprises dynamic random access memory (DRAM); and
the nonvolatile memory comprises a 3 dimensional cross-point memory.

3. The memory device of claim 1, wherein the nonvolatile memory provides a backup for the volatile memory.

4. The memory device of claim 1, wherein:
the memory buffer comprises a plurality of cache lines; and
the controller further comprises logic to invalidate the cache lines in the memory buffer when the cache line is written to the volatile memory.

5. The memory device of claim 1, wherein the controller comprises logic to receive a page-out request, and in response to the page-out request, to:
receive a read operation to a predetermined address;
in response to the read operation, reading a page of data from the nonvolatile memory to the memory buffer; and
writing the page of data to the nonvolatile memory.

6. An electronic device, comprising:
a processor to execute an operating system and at least one application;
a memory device comprising:
a volatile memory;
a nonvolatile memory; and
a controller comprising:
a memory buffer; and
logic to transfer data between the nonvolatile memory and the volatile memory via the memory buffer in response to requests from the application, wherein data in the memory buffer is accessible to the application; and
a driver to manage memory access operations between the at least one application and the memory device, wherein the driver comprises logic to:
generate a page-in request to move a page of data from non-volatile memory to volatile memory; and
invalidate one or more cache lines in the processor for the page.

7. The electronic device of claim 6, wherein:
the volatile memory comprises dynamic random access memory (DRAM); and
the nonvolatile memory comprises a 3 dimensional cross-point memory.

8. The electronic device of claim 6, wherein the nonvolatile memory provides a backup for the volatile memory.

9. The electronic device of claim 6, wherein the controller comprises logic to receive the page-in request, and in response to the page-in request, to:
move a page of data from the nonvolatile memory to the memory buffer;
provide a signal to the application that the page of data is available; and
in response to a read operation from the application, write a page of data from the memory buffer to the volatile memory.

10. The electronic device of claim 9, wherein:
the memory buffer comprises a plurality of cache lines; and
the controller comprises logic to invalidate the cache lines in the memory buffer when the cache line is written to the volatile memory.

11. The electronic device of claim 6, wherein the driver comprises logic to:
generate a page-out request to move a page of data from non-volatile memory to volatile memory.

12. The electronic device of claim 6, wherein the controller comprises logic to receive the page-out request, and in response to the page-out request, to:
receive a read operation to a predetermined address;

in response to the read operation, reading a page of data from the nonvolatile memory to the memory buffer; and write the page of data to the nonvolatile memory.

13. A controller for a memory device comprising a volatile memory and a nonvolatile memory, the controller comprising:

a memory buffer; and logic to transfer data between the nonvolatile memory and the volatile memory via the memory buffer in response to requests from an application, wherein data in the memory buffer is accessible to the application;

logic to receive a page-in request, and in response to the page-in request, to:

move a page of data from the nonvolatile memory to the memory buffer;

provide a signal to the application that the page of data is available; and in response to a read operation from the application, write page of data from the memory buffer to the volatile memory.

14. The controller of claim 13, wherein:

the volatile memory comprises dynamic random access memory (DRAM); and the nonvolatile memory comprises a 3 dimensional cross-point memory.

15. The controller of claim 13, wherein the nonvolatile memory provides a backup for the volatile memory.

16. The controller of claim 13, wherein:

the memory buffer comprises a plurality of cache lines; and the controller further comprises logic to invalidate the cache lines in the memory buffer when the cache line is written to the volatile memory.

17. The controller of claim 13, further comprising logic to receive a page-out request, and in response to the page-out request, to:

receive a read operation to a predetermined address;

in response to the read operation, reading a page of data from the nonvolatile memory to the memory buffer; and writing the page of data to the nonvolatile memory.

* * * * *